(12) United States Patent
Sugibayashi

(10) Patent No.: US 6,195,299 B1
(45) Date of Patent: Feb. 27, 2001

(54) SEMICONDUCTOR MEMORY DEVICE HAVING AN ADDRESS EXCHANGING CIRCUIT

(75) Inventor: Tadahiko Sugibayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/187,985

(22) Filed: Nov. 9, 1998

(30) Foreign Application Priority Data

Nov. 12, 1997 (JP) .................................................. 9-310800

(51) Int. Cl.[7] ....................................................... G11C 7/00
(52) U.S. Cl. .................. 365/200; 365/230.06; 365/225.7
(58) Field of Search ......................... 365/230.06, 230.03, 365/200, 225.7, 210

(56) References Cited

U.S. PATENT DOCUMENTS

| 5,373,471 | * | 12/1994 | Saeki et al. ............................ 365/200 |
| 5,596,542 | | 1/1997 | Sugibayashi et al. ........... 365/230.06 |
| 5,623,640 | * | 4/1997 | Nakabo ............................. 395/497.01 |
| 5,625,596 | * | 4/1997 | Uchida ................................... 365/200 |
| 5,889,712 | * | 3/1999 | Sugibayashi ........................... 365/200 |

FOREIGN PATENT DOCUMENTS

| 7-85696 | 3/1995 | (JP) . |
| 8-102529 | 4/1996 | (JP) . |

* cited by examiner

*Primary Examiner*—David Nelms
*Assistant Examiner*—Thong Le
(74) *Attorney, Agent, or Firm*—Young & Thompson

(57) ABSTRACT

A semiconductor memory device exchanges a defective address for a non-defective address so as to ensure continuous access to non-defective address areas. The memory cell array comprises a plurality of memory cell areas. An address decoder selects one of the memory cell areas. An address exchanging circuit exchanges a defective area address for a non-defective area address, and supplies the exchanged area address to the address decoder. Continuous access to non-defective areas is thereby obtained.

6 Claims, 12 Drawing Sheets

SEMICONDUCTOR MEMORY DEVICE HAVING AN ADDRESS EXCHANGING CIRCUIT

BACKGROUND OF THE INVENTION

1. Field of the Invention

The present invention relates to a semiconductor memory, and more particularly to a semiconductor memory that identifies a defective area address in advance and avoids the defective area address during use.

2. Description of Related Art

As the capacity of semiconductor memories has increased, production yield has decreased. Consequently, a memory has been proposed which seeks to avoid a defective address in use. This type of semiconductor memory is disclosed in Japanese Kokai No. 8-102529, which corresponds to U.S. Pat. No. 5,596,542.

The attached FIG. 1 shows a layout drawing of a cell array of this first example of prior art. A DRAM uses a double word-line structure comprising a main word line and a sub-word line. Therefore, a word line is selected in accordance with an X (low) address in a main word decoder column 401 and sub-word decoder column 402.

FIG. 2 shows the circuit diagram of the main word decoder of the first prior art. In the main word decoder, one end of a fuse 501 is connected to the inputs of an n-channel MOS transistor M3 and inverter INV24. The other end of the fuse 501 is connected to a power supply terminal Vcc. The output of the inverter INV24 is input to the gate electrode of the nMOS transistor M3, one input of an AND circuit and the gate electrode of an nMOS transistor M1. The nMOS transistors M1 and M2 control the potential of a precharged roll-call signal RCX. The output of an inverter INV21 for inverting a block selection signal BSL is connected to the other inputs of the AND circuit. Address signals X4TX5Tn and X2TX3Tn are input to a NAND circuit. The output of the NAND circuit is input to a first NOR circuit NOR1 together with the inverted signal of a block selection signal BSL. The output of the first NOR circuit NOR1 is input to a second NOR circuit NOR2 together with the output of the AND circuit. Moreover the output of the first NOR circuit NOR1 is input to the gate electrode of the nMOS transistor M2 for controlling the roll-call signal RCX. The output of the first NOR circuit NOR1 is connected to a main word line MWL through an inverter INV22 and an inverter (driver) INV23 driven by a boosted power supply voltage VBOUT. The output of the second NOR circuit NOR2 is connected to a main word line MWLB.

By disconnecting the fuse 501, a word line connected to the main word line MWL output from the main word decoder and a memory cell connected to the word line are disabled. Whether the fuse 501 is disconnected can be read from the outside through a roll-call test. In the roll-call test mode, it is detected whether the roll-call signal RCS connected in accordance with the wired OR logic is dropped to a low level. The user of the DRAM of this conventional example first performs the roll-call test and enters the X address of a defective cluster (a cluster is constituted of a plurality of sectors) in a defective-address table before using the DRAM.

It has also been proposed to convert a defective address and use it as a ¼-capacity memory in order to salvage damaged production and to prevent yield from decreasing. This is disclosed in Japanese Kokai No. 7-85696. FIG. 3 shows a block layout drawing of this second prior art. The second prior art have a double-line structure comprising a main word line and a sub-word line. FIG. 4 shows a block diagram of the address-system circuit of the second prior art.

In the case of the second prior art, the X address is determined by the 10 bit address X0 to X9, and the Y address is determined by the 10 bit address Y0 to Y9. Address bits X9 and Y9 are the most-significant address bits. The inside of the memory is divided into four regions by the most-significant address bits, X9 and Y9. As shown in FIG. 3, if a defective cell is present in blocks containing (X9, Y9)=(0, 0) and (0, 1), the address is converted by the address conversion circuit of FIG. 4 so that the block containing (1, 0) is physically selected when (X9, Y9)=(0, 0) is input. Moreover, the three other blocks are disabled and shipped as ¼-capacity memories.

In the case of a storage device such as a hard disk, input and output buses use the same wiring in order to decrease the number of bus wirings. Thus, a bus using a common input and output, inputs the first sector address and the number of sectors to be continuously accessed with a command in order to improve the bus utilization efficiency and thereafter, an operation mode for transferring only input/output data is prepared. In the case of this operation mode, the bus utilization efficiency is improved because it is unnecessary to input a command for each sector. However, when a defective cluster is present and sector addresses are not continued, it is impossible to use the continuous-access operation mode.

The first prior art has a problem that the throughput of data is deteriorated because the continuous access mode cannot be used if a defective cluster is present. The second prior art has another problem that capacity is greatly decreased because the capacity is decreased to ¼. Moreover, a simple address conversion can cause address duplication of a previously defective address and a non-defective address.

SUMMARY OF THE INVENTION

Accordingly, it is an object of the present invention to provide a novel semiconductor memory device that avoids the above problem of the prior art.

It is another object of the present invention to provide a semiconductor memory having a wide continuously-accessible region and a high effective data transfer rate.

It is another object of the present invention to exchange a defective address for a non-defective address without greatly increasing either the number of circuit elements or the chip area, wherein an address exchange is performed simply by inverting an address in a decoder, and an address exchanging circuit is located at the intersection between a main word decoder and a column decoder.

These and other objects of the present invention will be more apparent to those of skill in the art from the following detailed specification and accompanying figures.

DESCRIPTION OF THE PREFERRED EMBODIMENTS

In the present invention, a defective address is exchanged for a non-defective address in a manner that ensures continuous access to non-defective address areas.

Figure 6:
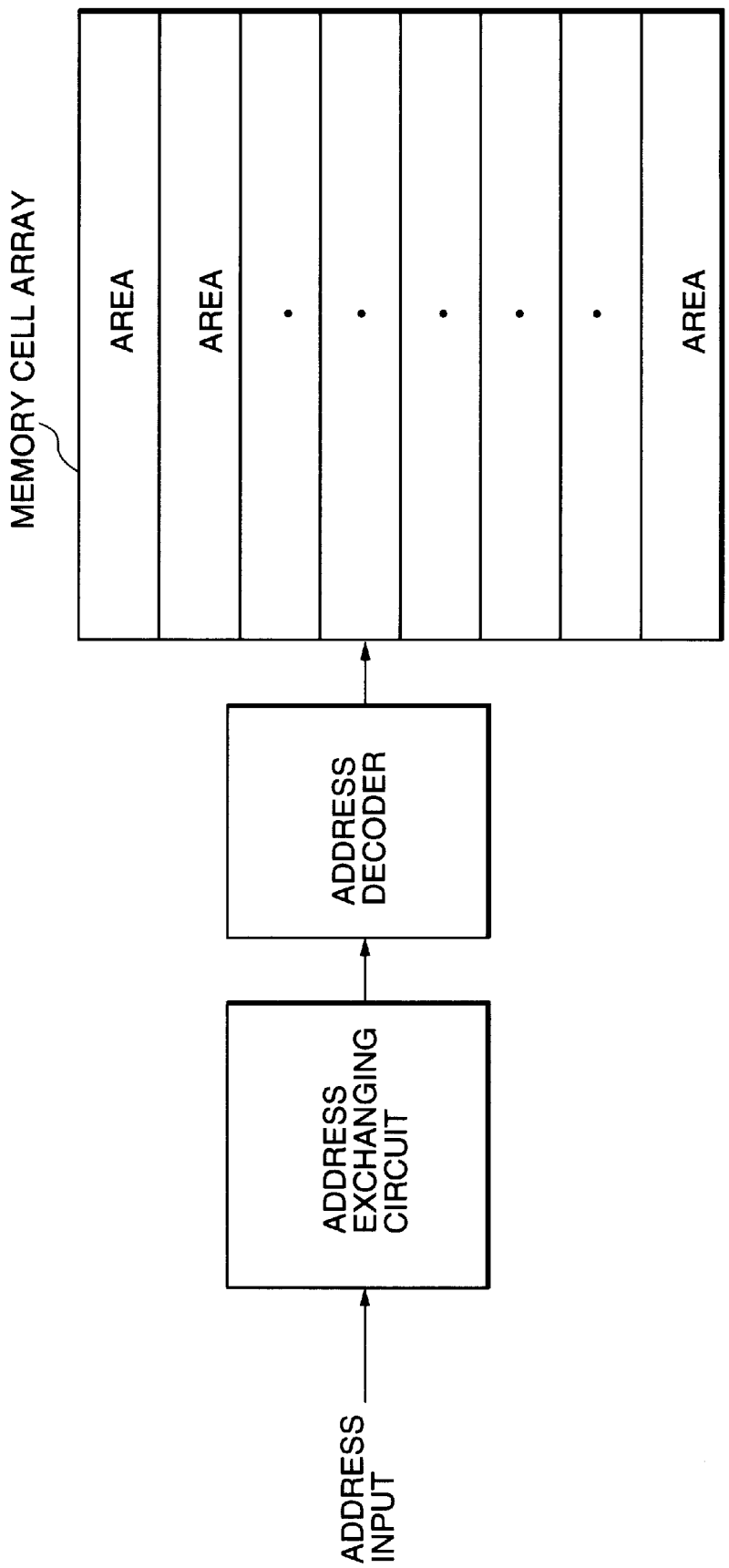
FIG. 6 is a block diagram illustrating the operating principle of the semiconductor memory of the present invention.

The principal concept of the present invention is explained in FIG. 6. In FIG. 6, a memory cell array comprises a plurality of memory cell areas. An address decoder selects one of the memory cell areas. An address exchanging circuit exchanges a defective area address for a non-defective area address. Continuous access to non-defective areas is thereby obtained. The exchange circuit replaces a defective address with a different form using a redundant circuit, or accesses addresses so as to skip over a defective address.

Figure 7:
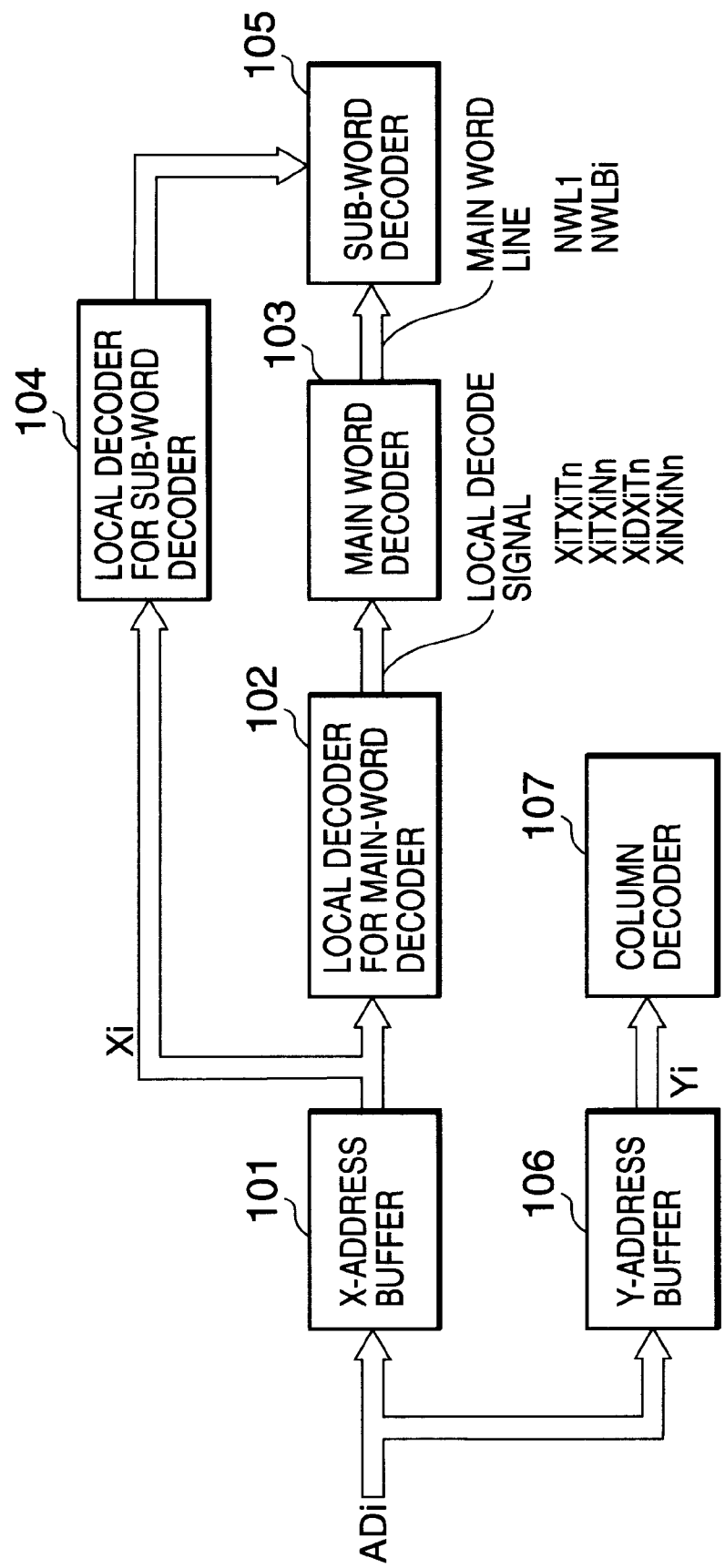
FIG. 7 is a circuit diagram one embodiment of the present invention.

A first embodiment of the present invention will now be described with reference to FIGS. 7–11. The semiconductor memory of this embodiment uses a double line structure comprising a main word line and a sub-word line and, as shown in FIG. 7, has an X-address buffer 101, a local decoder 102 for the main word decoder, a main word decoder 103, a local decoder 104 for the sub-word decoder, a sub-word decoder 105, a Y-address buffer 106, and a column decoder 107.

Figure 1:
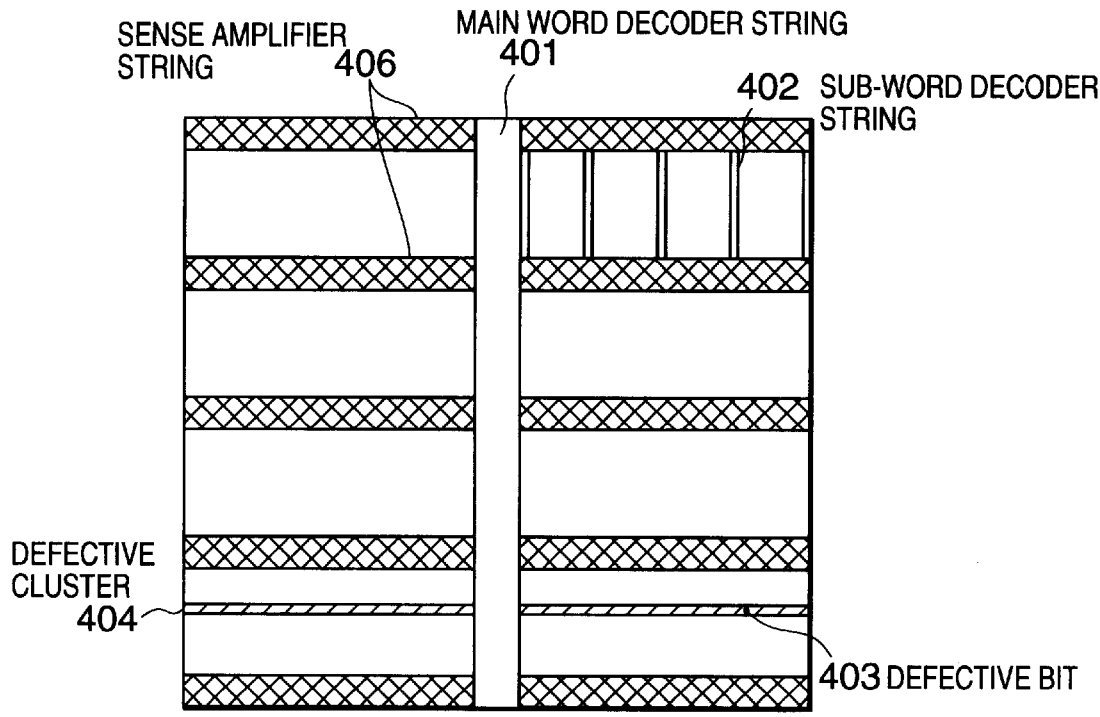
FIG. 1 is a layout drawing of the circuit of the first example of prior art.
Figure 2:
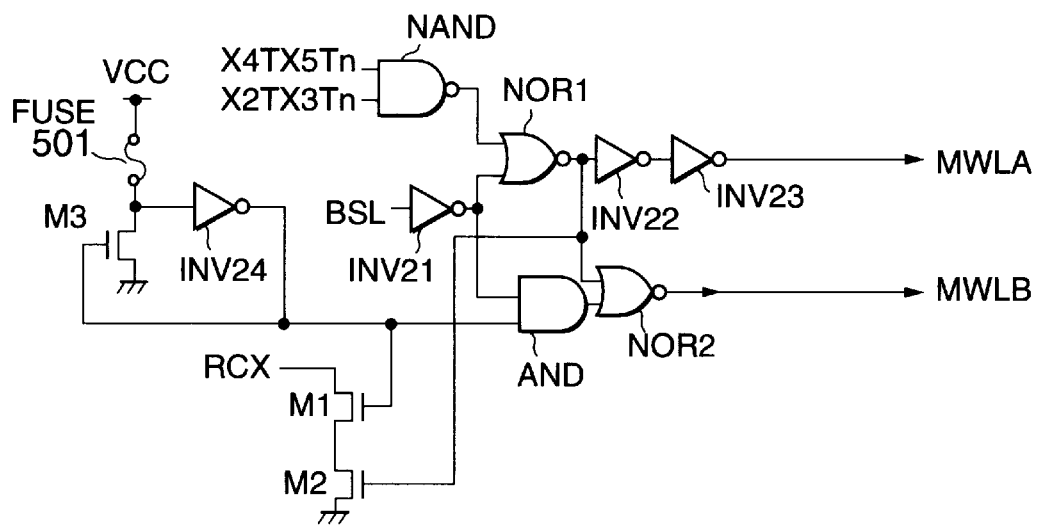
FIG. 2 is a circuit diagram of the main word decoders of the first prior art.
Figure 3:
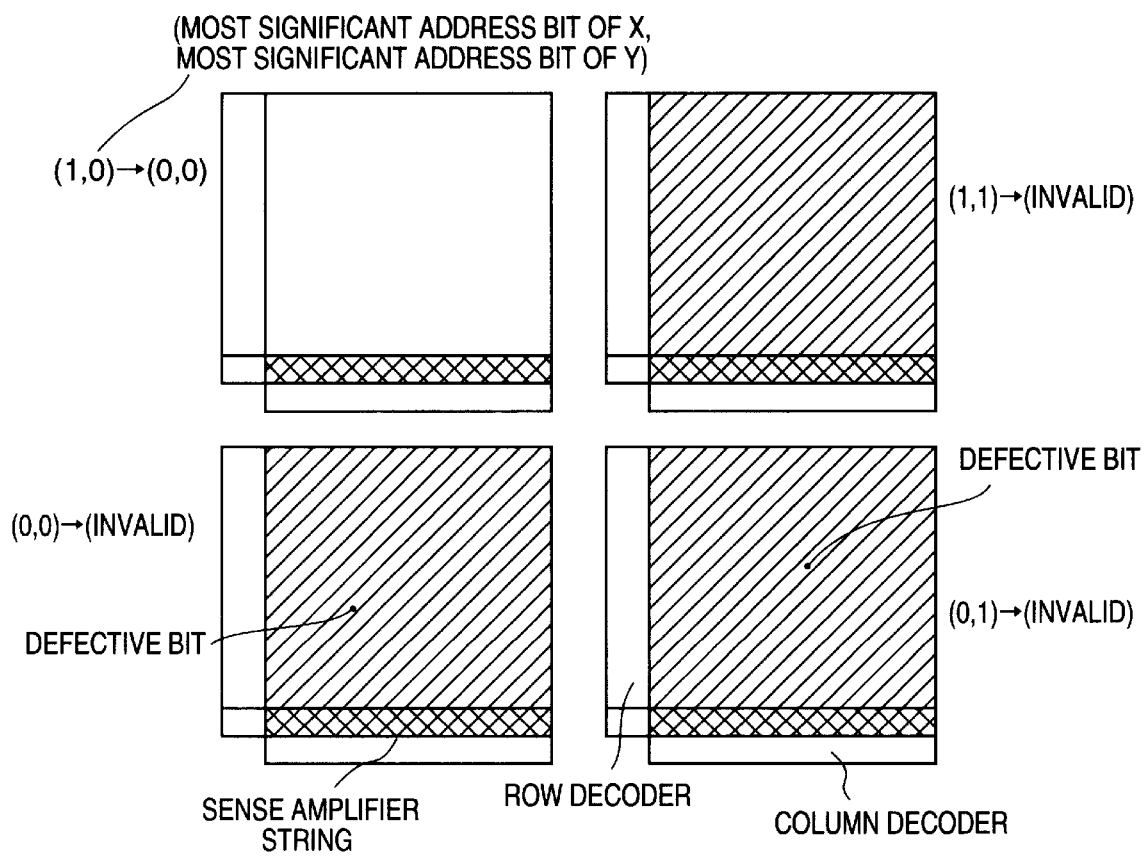
FIG. 3 is a layout drawing of the circuit of the second example of prior art.
Figure 4:
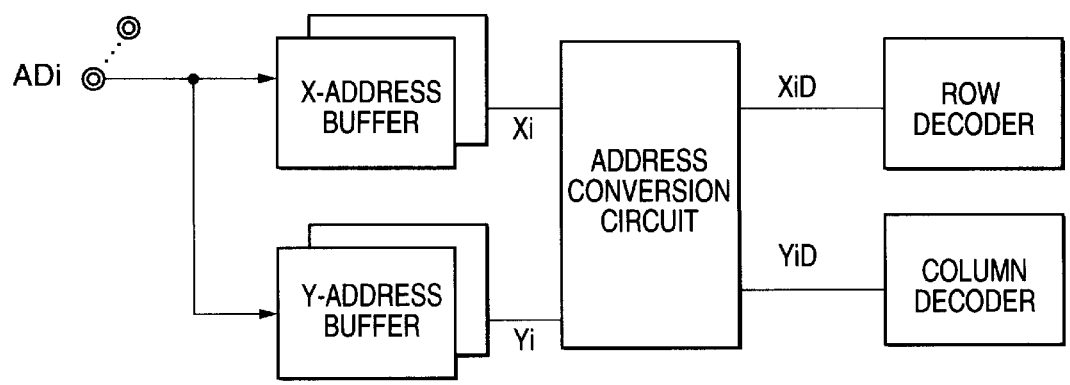
FIG. 4 is a block diagram showing a signal of the address-system circuit of the second prior art.

An X address (Xi) is input to the local decoder 102 for the main word decoder and local decoder 104 for the sub-word decoder from the X-address buffer 101. The output of the local decoder 102 is input to the main word decoder 103 and a main word line is output. The main word decoder 103 of this embodiment may have the conventional circuit layout shown in FIG. 2. The main word line is input to the sub-word decoder 105 to select a sub-word line. Cells for two sub-word lines are used as one sector. Moreover, a main word line is constituted with 8 sectors because it selects 16 sub-word lines. The aggregate of the sectors is referred to as a cluster.

This embodiment performs address conversion in main word decoder strings. Two X addresses X0 and X1 from the least significant digit are locally decoded by the local decoder 104 and then input to the sub-word decoder 105. The sub-word decoder 105 decodes addresses included in a main word line and those excluded from the main word line and finally decodes every address and selects two sub-word lines (although one or four can be selected instead of two). Normally, a main word line decoded by main word decoder 103 and a locally-decoded signal by the local decoder 104 are input to the sub-word decoder 105. The signal is locally decoded in order to simplify the circuit structure of the sub-word decoder 105. The sub-word decoder 105 can be decreased in area because many sub-word decoders are present on a chip.

Figure 11:
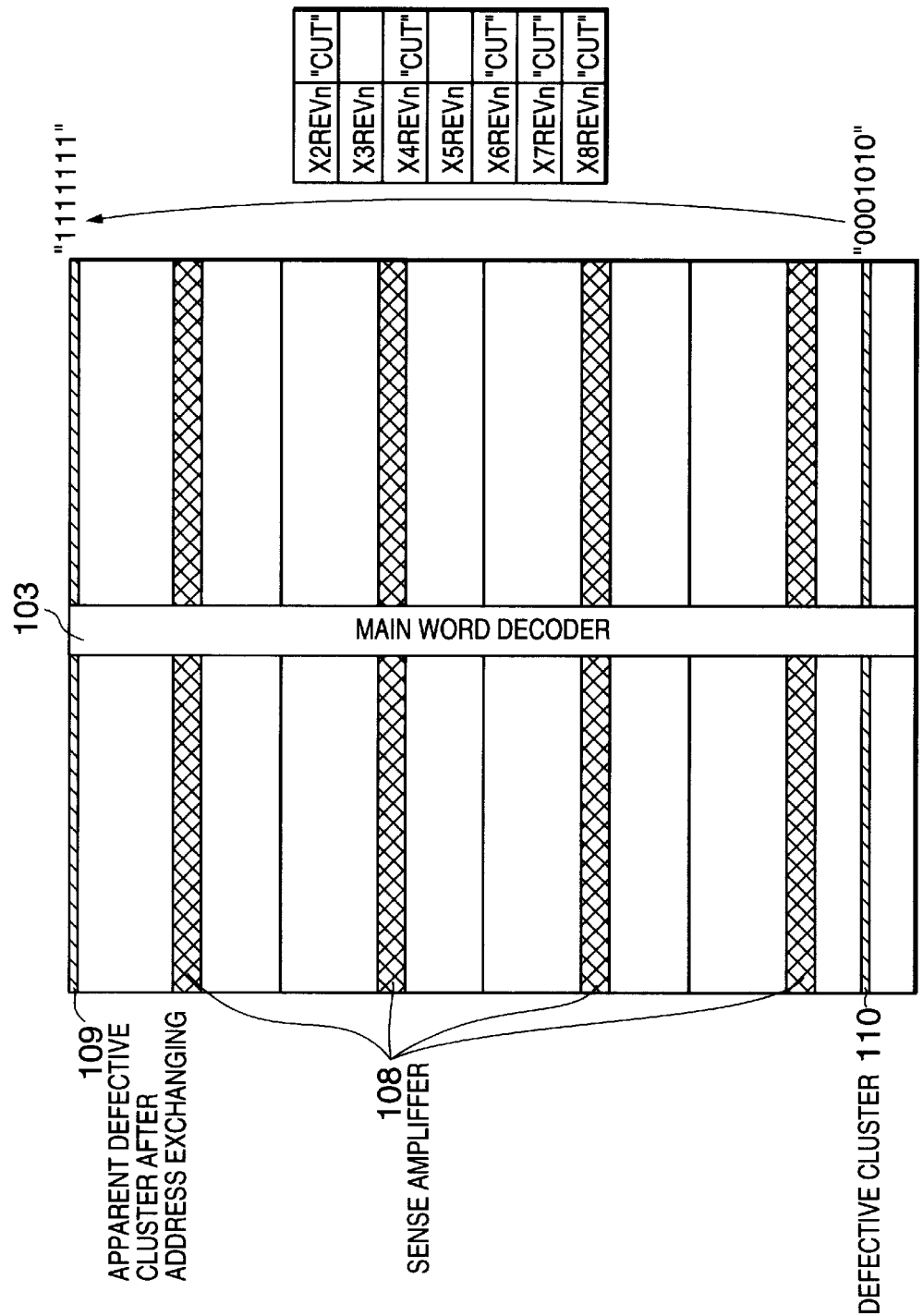
FIG. 11 is a layout diagram showing an address exchange by this embodiment.

FIG. 11 shows an example of address exchanging by this embodiment. The X address of a defective cluster is shown as "0001010" when represented by address bits X8 to X2 decoded by the main word decoder 103. Among these address bits, bits X2, X4, X6, X7, and X8 are inverted and the defective cluster address "0001010" is thereby exchanged for a non-defective cluster address "1111111". This address exchanging increases the capacity for continuously accessing sectors. That is, when an address to select a defective cluster of "0001010" is input to this embodiment, a non-defective cluster of "1111111" is nevertheless physically selected. Therefore, it is possible to continuously access sectors: that is, divided non-defective cluster addresses from "0000000" to "0001001", and from "0001011" to "1111111" in the conventional techniques, are improved to continuous non-defective cluster addresses from "0000000" to "1111110" according to the present invention.

On the other hand, when inputting addresses from the outside in order to select a cluster of "1111111", the defective chamber of "0001010" is physically selected. As with the first example of prior art, therefore, the user of the DRAM of this embodiment first performs a roll-call test and enters the X address of this defective cluster in a defective-address table before using the DRAM.

Figure 10:
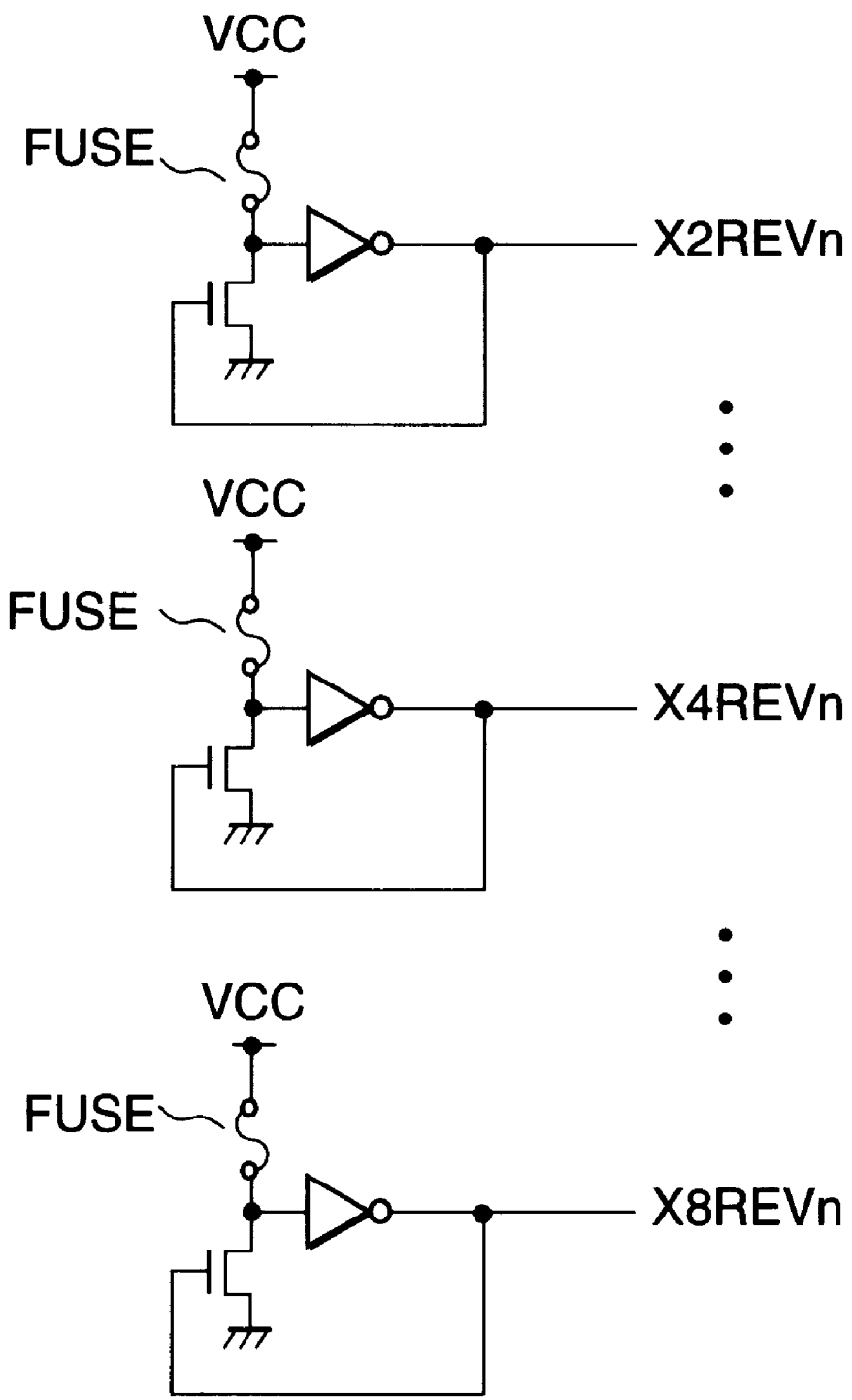
FIG. 10 is a circuit diagram of fuse circuits of an embodiment of the present invention.

The table on the right-hand side of FIG. 11 shows whether to cut the fuse in FIG. 10.

Figure 14:
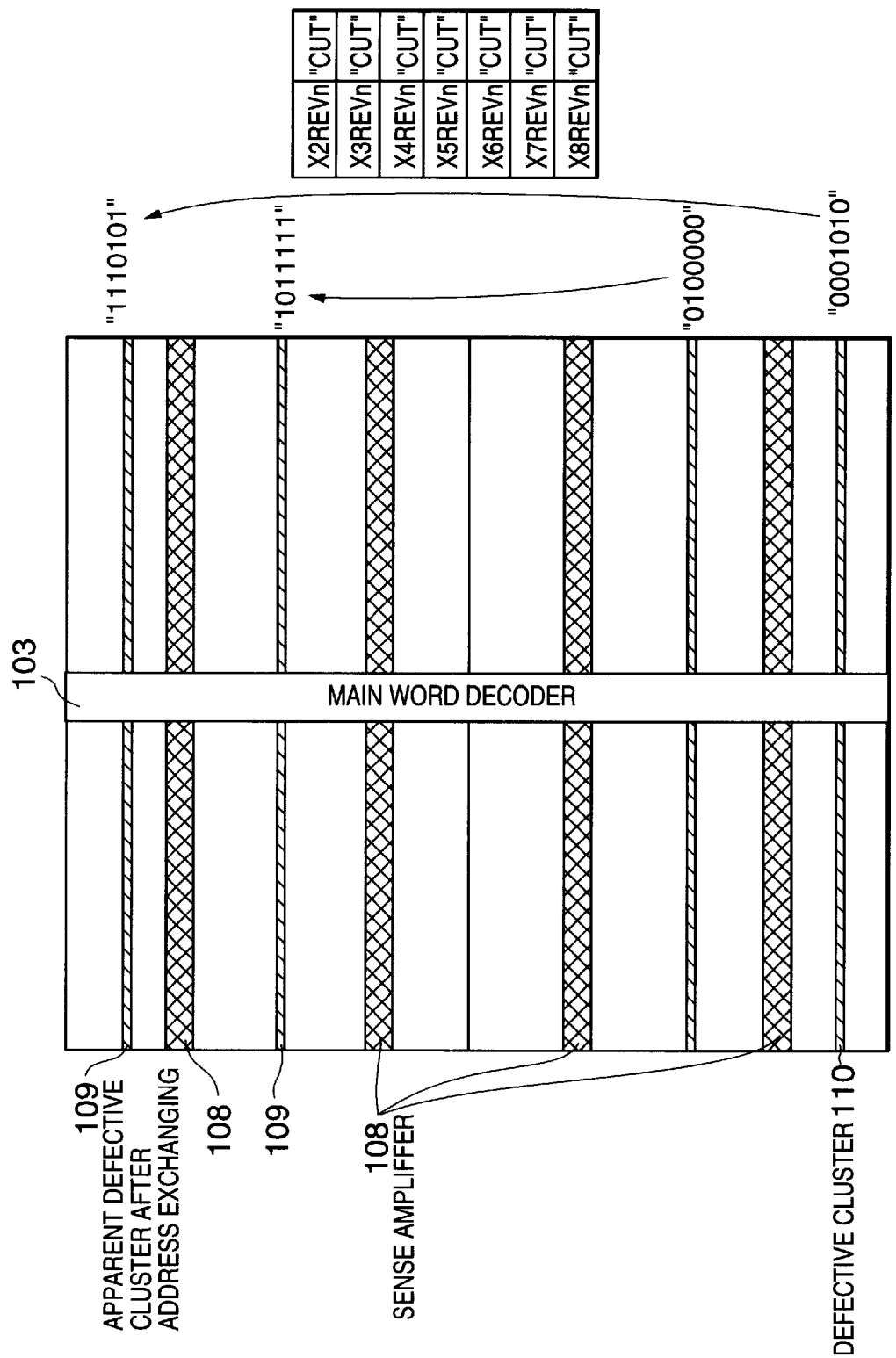
FIG. 14 is a layout drawing showing another address exchange by an embodiment of the present invention.

FIG. 14 shows a case in which two defective clusters are present. In this case, by inverting all of the address bits, it is possible to continuously access clusters from a cluster address "0000000" up to a cluster address one before a cluster address "1011111". That is, it is possible to access up to a cluster having an address one before the address of an exchanged defective cluster address, in order to apparently convert a defective cluster into a higher-order address and ensure continuous access to non-defective clusters having lower-order addresses.

Figure 8:
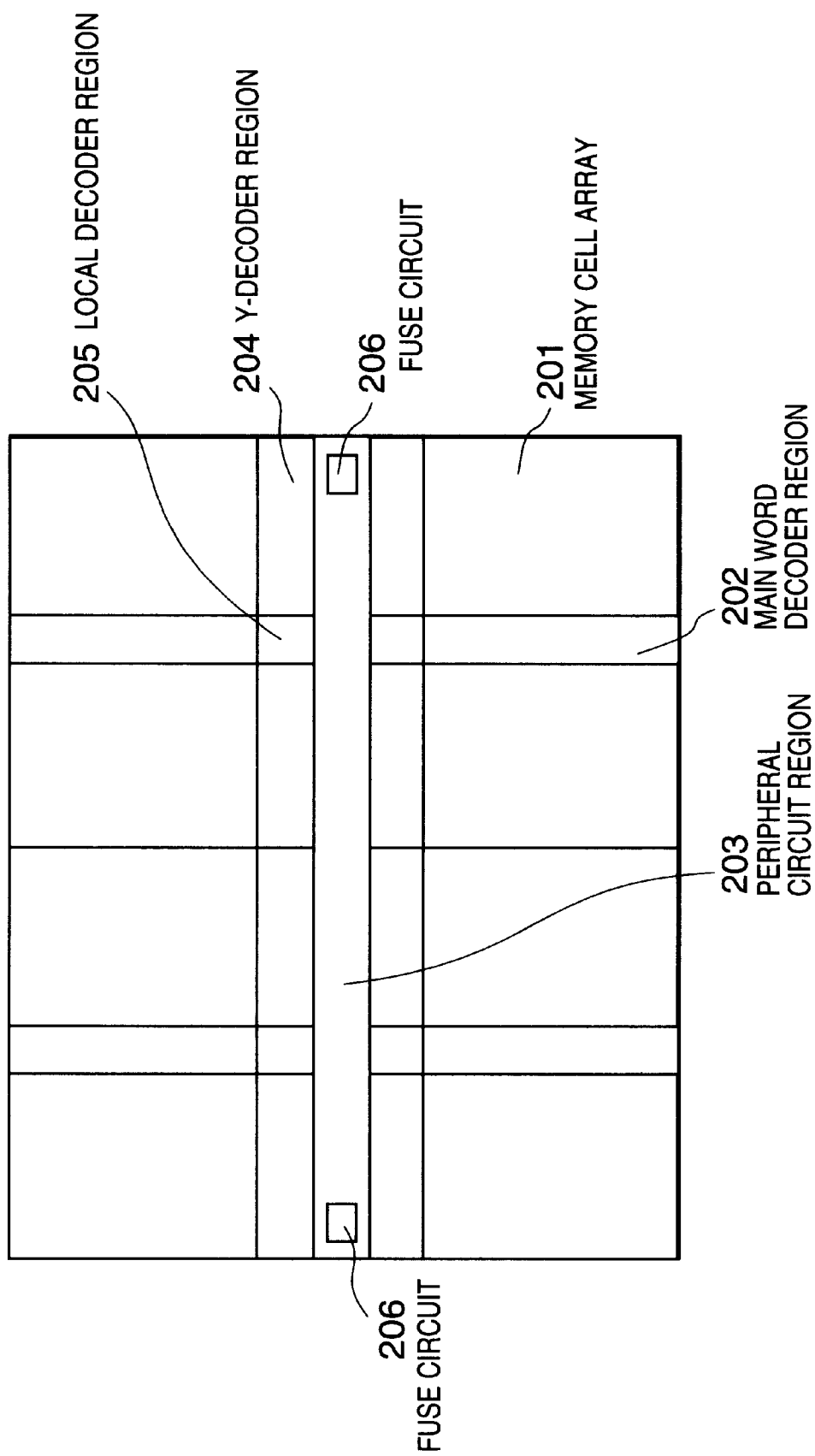
FIG. 8 is a layout drawing of the semiconductor memory in FIG. 7.
Figure 9:
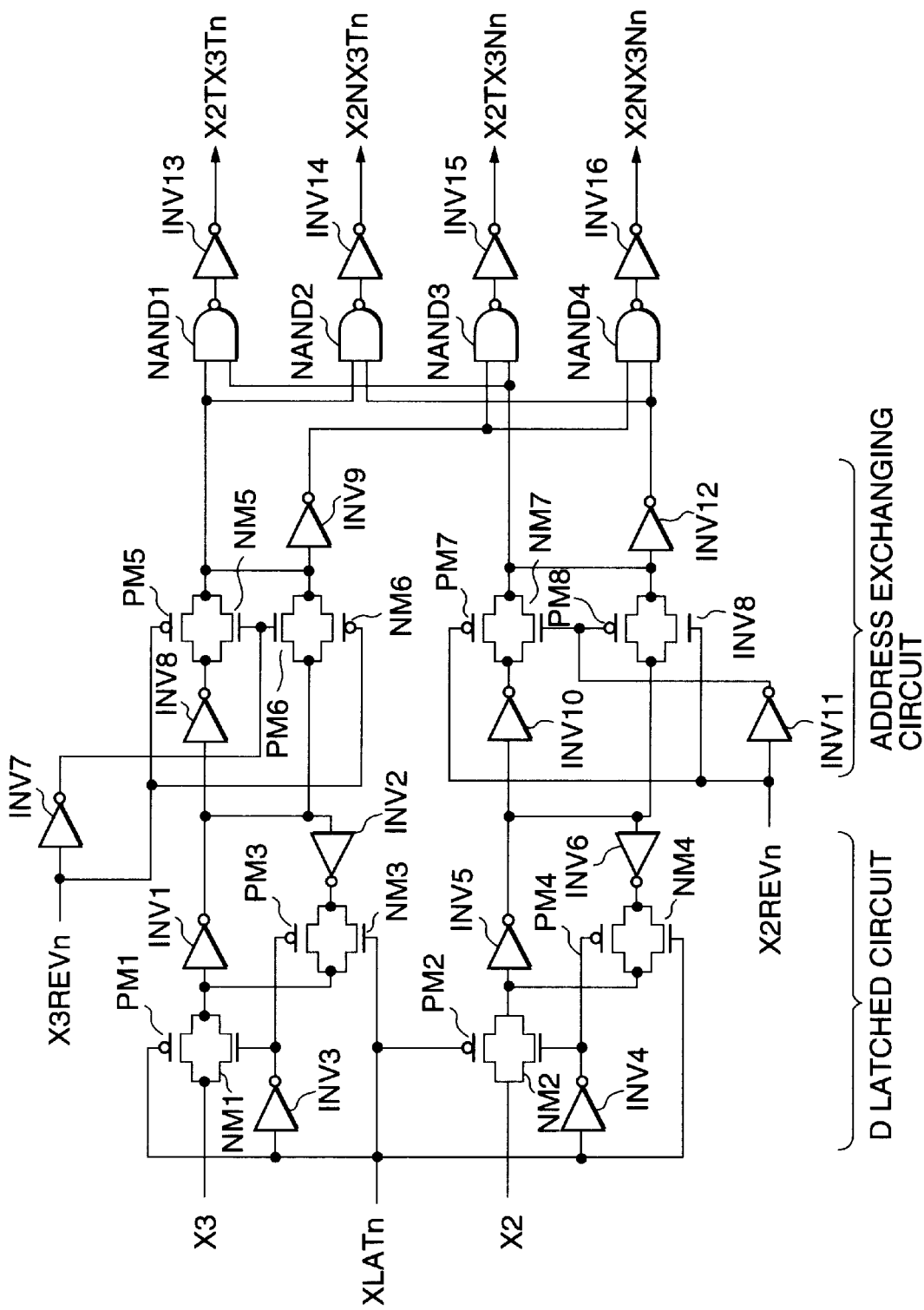
FIG. 9 is a circuit diagram of a D latched circuit and an address exchange circuit.

In FIG. 8, a memory cell array 201 is divided into 8 parts by a main word decoder region 202 and a peripheral circuit region 203. A local decoder region 205 is present at the intersection between the main word decoder region 202 and a Y decoder region 204 in which the local decoder 102 for main word decoder is set. FIG. 9 shows a circuit diagram of local decoder 102. Inverters INV4 and INV5, PMOS transistors PM2 and PM4, and NMOS transistors NM2 and NM4 constitute a D latched circuit for latching an address X2 in accordance with a latch signal XLATn. Inverters INV1 and INV2, and INV3, PMOS transistors PM1 and PM3, and NMOS transistors NM1 and NM3 constituted a D latched circuit for latching an address X3 in accordance with a latch signal XLATn. Inverters INV7, INV8, and INV9, PMOS transistors PM5 and PM6, and NMOS transistors NM5 and NM6 constitute an address conversion circuit for the address X3. Inverters INV10, INV11, and INV12, PMOS transistors PM7 and PM8, and NMOS transistors NM7 and NM8 constitute an address conversion circuit for the address X2. The addresses X2 and X3 are decoded by NAND circuits NAND1 to NAND2 and amplified by inverters INV13 to INV16.

Figure 5:
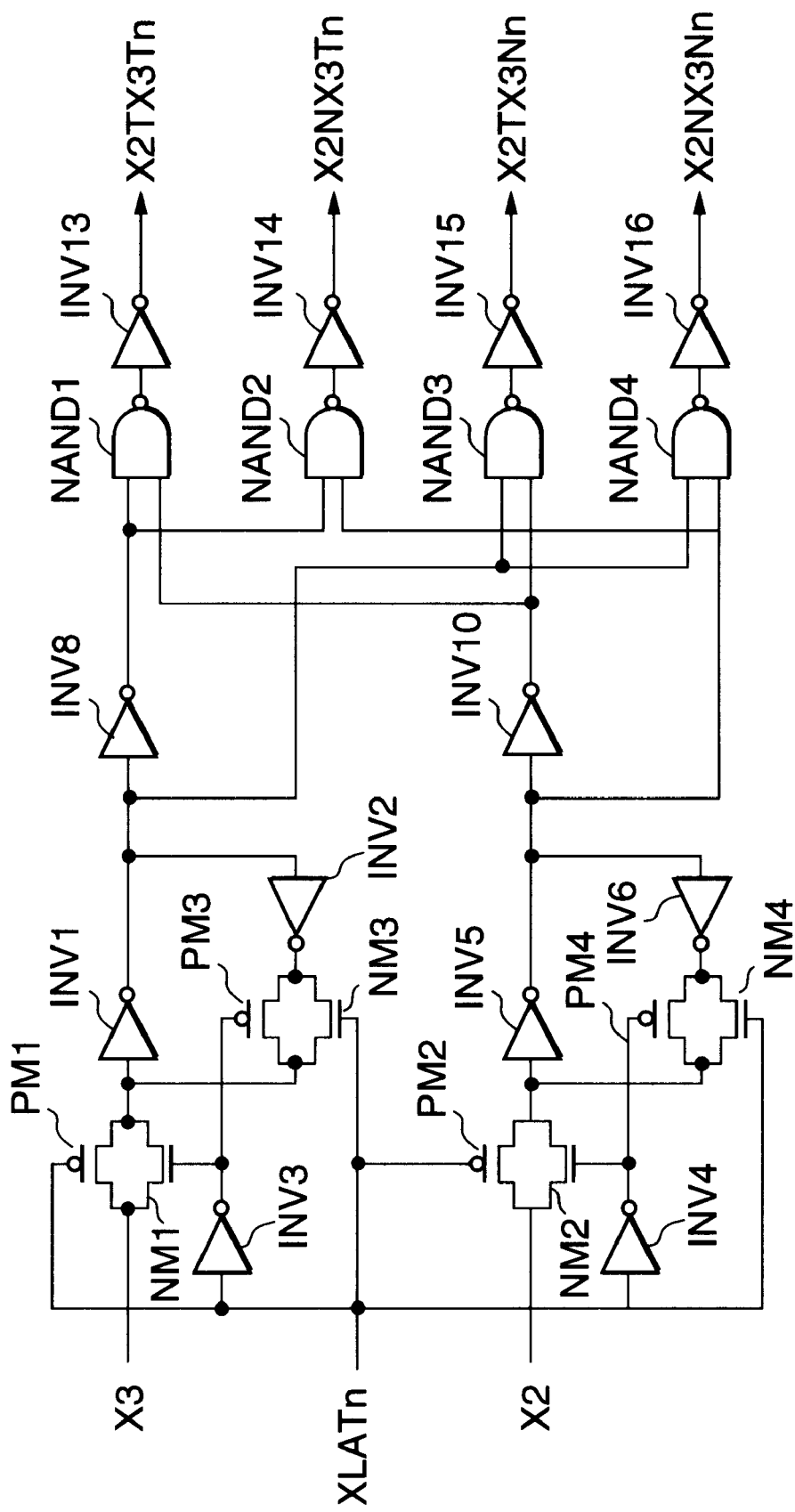
FIG. 5 is a circuit diagram of the local decoder circuit.

For example, the X2 address is captured by a D latched circuit while the latch signal XLATn is high-level, and is latched when the latch signal changes to low-level. A signal X2REVn is set to high level when a defective cluster address can be exchanged for a higher-order non-defective cluster address by inverting the value of the latched address bits with an address conversion circuit. The signal X2REVn and the like is generated by the fuse circuit shown in FIG. 10. When cutting off a fuse, X2 is converted into an inverted value. The fuse circuit, which requires a relatively large area, is positioned at one end of the peripheral circuit region 203 (fuse circuit 206 in FIG. 8) in contrast to the local decoder region 205 whose size is determined by a decoder. In the case of a large-capacity DRAM, a signal line has a hierarchical structure in order to establish a uniform wiring delay. Because wiring delays are concentrated on the center of the chip, positions outside of the peripheral circuit region 203 have greater design flexibility. FIG. 5 shows a conventional local decoder circuit for comparison.

Figure 15:
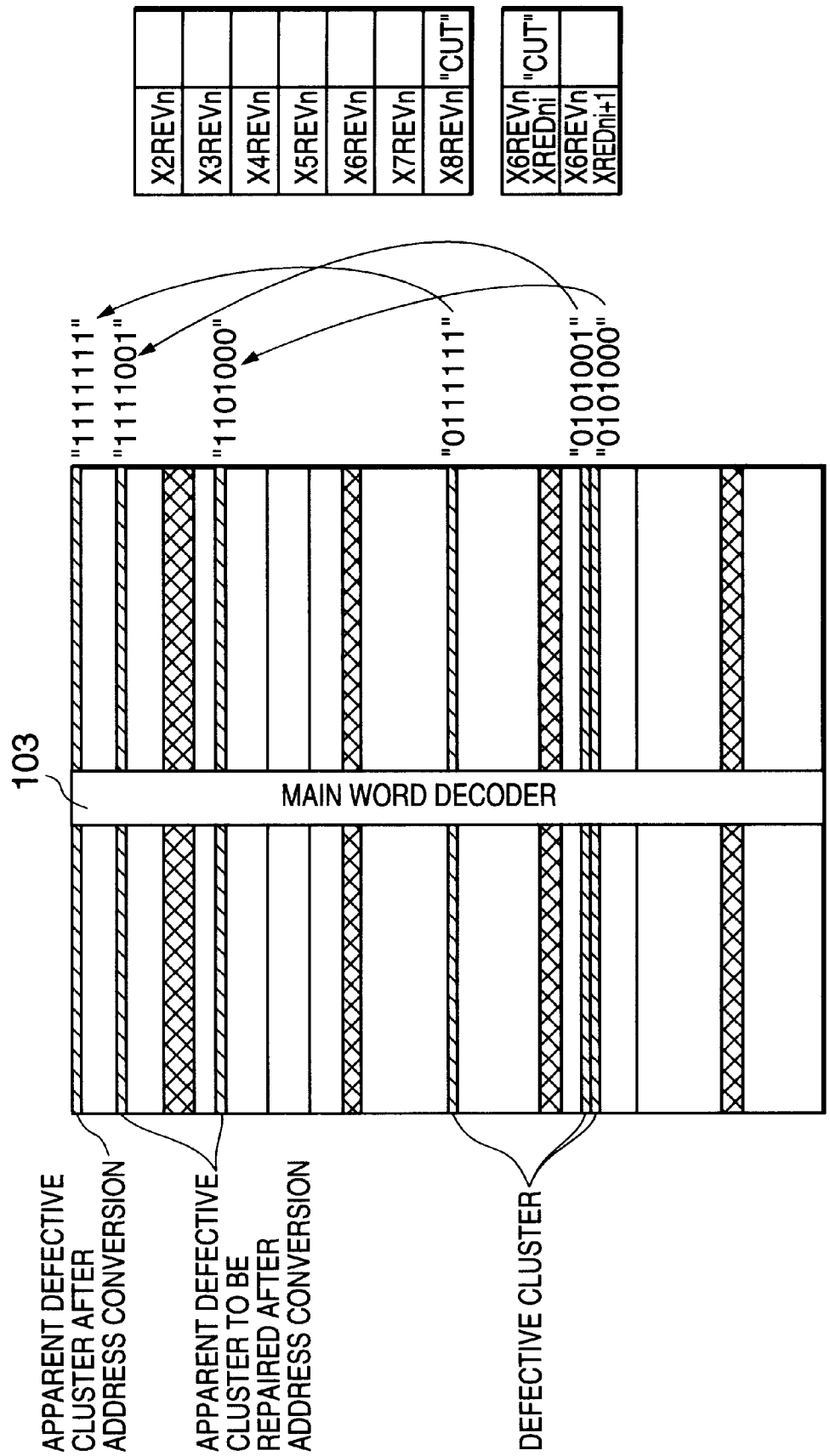
FIG. 15 is a layout drawing showing the address exchange in FIG. 14.

A second embodiment of the present invention will now be described with reference to FIGS. 12–15. In this description, the semiconductor memory is used in combination with a redundancy circuit. In this case, a replacement main word line is stored in each memory block. However, as shown in FIG. 15, because main word lines are short-circuited in one block, two clusters may be defective. In this case, the address X6 is converted only when a redundancy word line is selected, and thereafter, the redundancy word line is replaced with a spare main word line. When two clusters become defective due to a short circuit, the number of main word lines (clusters) available for replacement within a given block becomes insufficient, and replacement main word lines (clusters) of an adjacent block are therefore used.

For example, in FIG. 15, 3 defective clusters, or main word lines, "0101000", "0101001", "0111111" exist in a memory cell array. At first, the defective cluster "0101000" is exchanged for a non-defective cluster "1101000", the defective cluster "0101001" is exchanged for a non-defective cluster "1111001", and the defective cluster "0111111" is exchanged for a non-defective cluster "1111111". Fuse "X8REVn" is therefore cut. Clusters having common X8-X6 address bits share the same block, and thus the same spare word line. Therefore, both of the exchanged defective addresses "1101000" and "1101001" are replaced with the spare word line of a common block. Accordingly, fuse "X6REVnXREDni" is cut, and the exchanged defective cluster address "1101001" is further converted to the address "1111001" of another block. As a result, defective address "1101000" and "1111001" are repaired by spare word lines.

Figure 12:
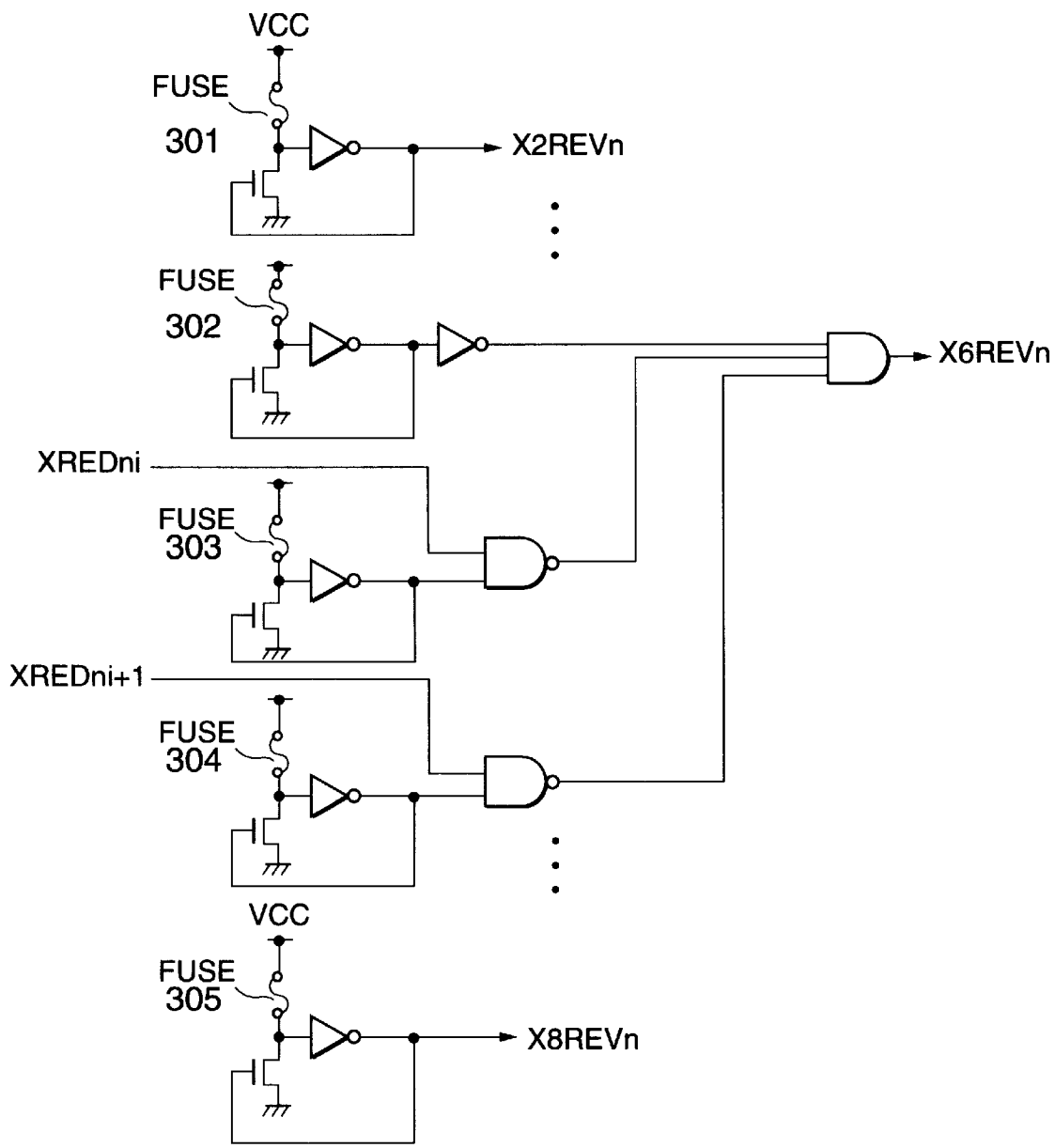
FIG. 12 is a circuit diagram of fuse circuits of another embodiment of the present invention.
Figure 13:
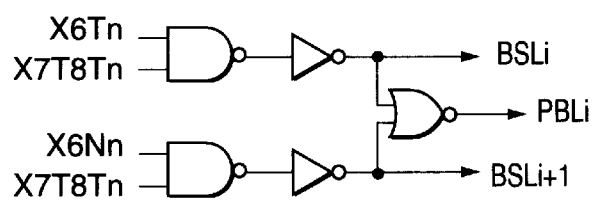
FIG. 13 is a circuit diagram of a block selection signal generation circuit of this embodiment.

FIG. 12 shows a specific fuse circuit. Symbols X2REVn, X3REVn, . . . , and X6REVn denote latched signals of address exchanging circuits (see FIG. 9) of addresses X2, X3, . . . , and X6. In FIG. 12, X2REV–X5REV, X7REV, X8REV except X6REV are the same as X2REV–X5REV, X7REV, X8REV in FIG. 10. Only when a redundancy word line activation signal XREDni becomes high-level, an address is converted by an address exchanging circuit. FIG. 13 shows a block selection signal generation circuit of this embodiment. This circuit is set in the intersectional region between a main word decoder region and a sense amplifier region. Symbol X6T denotes the signal of the address X6 amplified in a local decoding region and X7T8T denotes a signal in which addresses X7 and X8 are decoded. Symbol BSL denotes a block selection signal to select a main word decoder or the like. Symbol PBLi denotes a signal for selecting a sense amplifier string. Because the sense amplifier string is shared by two blocks, it has logic obtained by OR of a block selection signal. The output PBLi of those of the circuit in FIG. 13 is input to a sense amplifier string and the output BSLi of them is input to a main word decoder string. Though memory blocks at both sides of a sense amplifier are selected by the address X6, the sense amplifier is shared by two blocks and it is not related to a bit-line precharge stop signal PBLi. In the case of a DRAM, precharge is stopped and then, a word line is raised. Therefore, conversion of the address X6 has only a minimal influence on access time, even if the conversion is performed after a redundancy signal XREDi is activated. That is, the address X6 can be delayed compared to other block selection addresses.

While preferred embodiments of the present invention have been described above, it is to be understood that the invention is to be defined by the appended claims when read in light of the specification and when accorded their full range of equivalents.

What is claimed is:

1. A semiconductor memory device comprising:
   a memory cell array divided into a plurality of areas;
   an address decoder for selecting the plurality of areas; and
   an address exchanging circuit for: i) exchanging a defective area address for a non-defective area address, ii) exchanging the non-defective area address for the defective area address, and iii) supplying an exchanged area address to the address decoder,
   wherein the non-defective area address that replaces the defective area address has a highest value among said plurality of areas.

2. A semiconductor memory device comprising:
   a memory cell array divided into a plurality of areas;
   an address decoder for selecting the plurality of areas; and
   an address exchanging circuit for: i) exchanging a defective area address for a non-defective area address, ii) exchanging the non-defective area address for the defective area address, and iii) supplying an exchanged area address to the address decoder,
   wherein the address exchanging circuit exchanges addresses such that continuous access to non-defective areas is provided, and
   wherein the non-defective area address before exchanging is the highest address of the plurality of areas.

3. A semiconductor memory device comprising:
   a memory cell array divided into a plurality of areas;
   an address decoder for selecting the plurality of areas; and
   an address exchanging circuit for: i) exchanging a defective area address for a non-defective area address, ii) exchanging the non-defective area address for the defective area address, and iii) supplying an exchanged area address to the address decoder,
   further comprising a setting circuit setting the address exchanging circuit;
   wherein the address exchanging circuit exchanges addresses by selecting an inverted output or a non-inverted output for each address bit according to said setting circuit.

4. The semiconductor memory device according to claim 3, wherein the setting circuit comprises a fuse corresponding to the setting.

5. A semiconductor memory device comprising:
   a memory cell array comprising a plurality of blocks, each of the plurality of blocks having a plurality of main word lines;

a main word decoder selecting the plurality of blocks and the plurality of the word lines;

a defective area address indicator that signals when the address decoder selects a defective word line; and an address exchanging circuit exchanging a defective word line address for a non-defective word line address, exchanging the non-defective area address for the defective area address, and supplying an exchanged word line address to the address decoder, wherein each of said plurality of blocks further comprises a redundant main word line different than the plurality of main word lines, and the address exchanging circuit further converts addresses so that the main word decoder selects a redundant main word line of one of the plurality of blocks excluding a block containing a replaced defective main word line.

6. The semiconductor memory device to claim 5, wherein one of said plurality of blocks shares a sense amplifier with another of said plurality of blocks, and the address exchange circuit converts addresses such that the main word decoder selects the redundant main word line of another block sharing the same sense amplifier.

* * * * *